US009121579B2

(12) United States Patent
Hwu et al.

(10) Patent No.: US 9,121,579 B2
(45) Date of Patent: Sep. 1, 2015

(54) METHOD FOR MANUFACTURING INTEGRALLY FORMED MULTI-LAYER LIGHT-EMITTING DEVICE

(75) Inventors: Jon-Fwu Hwu, Hsinchu (TW); Yung-Fu Wu, Hsinchu (TW); Kui-Chiang Liu, Hsinchu (TW)

(73) Assignee: GEM WELTRONICS TWN CORPORATION, Hsinchu County (TW)

( * ) Notice: Subject to any disclaimer, the term of this patent is extended or adjusted under 35 U.S.C. 154(b) by 797 days.

(21) Appl. No.: 13/457,833

(22) Filed: Apr. 27, 2012

(65) Prior Publication Data

US 2013/0283604 A1 Oct. 31, 2013

(51) Int. Cl.

| | |
|---|---|
| ***H05K 3/30*** | (2006.01) |
| ***F21V 7/22*** | (2006.01) |
| ***F21K 99/00*** | (2010.01) |
| ***F21V 29/77*** | (2015.01) |
| *F21V 23/00* | (2015.01) |
| *F21Y 101/02* | (2006.01) |

(52) U.S. Cl.

CPC ... *F21V 7/22* (2013.01); *F21K 9/00* (2013.01); *F21K 9/90* (2013.01); *F21V 29/773* (2015.01); *F21V 23/002* (2013.01); *F21Y 2101/02* (2013.01); *Y10T 29/49117* (2015.01)

(58) Field of Classification Search

CPC .......... F21K 9/00; F21V 7/22; F21V 29/773; Y10T 29/49117; Y10T 29/4913; F21Y 2101/02; F21Y 23/002

USPC ........ 29/831, 832, 840, 542; 257/79, 99, 712; 361/707, 709, 718; 362/218, 294, 373

See application file for complete search history.

(56) References Cited

U.S. PATENT DOCUMENTS

| | | | | |
|---|---|---|---|---|
| 7,236,366 | B2 * | 6/2007 | Chen | 361/709 |
| 8,382,325 | B2 * | 2/2013 | Hisayasu | 362/373 |
| 8,445,936 | B1 * | 5/2013 | Hwu et al. | 257/99 |

FOREIGN PATENT DOCUMENTS

| | | |
|---|---|---|
| TW | M387375 | 8/2010 |

* cited by examiner

*Primary Examiner* — Donghai D Nguyen

(74) *Attorney, Agent, or Firm* — Lin & Associates IP, Inc.

(57) ABSTRACT

A method for manufacturing an integrally formed multi-layer light-emitting device is provided, in which a seat is integrally formed in such a manner that the light-emitting elements can be directly disposed in the chamber. The lens mask is used to seal the light-emitting elements in the chamber of the seat so that some packaging steps can be omitted, and the manufacturing process is simplified. The seat is made of metal having good thermal conductivity instead of plastic materials. The consumption of the package material is reduced, and the heat-dissipation efficiency is increased in the present invention.

12 Claims, 14 Drawing Sheets

METHOD FOR MANUFACTURING INTEGRALLY FORMED MULTI-LAYER LIGHT-EMITTING DEVICE

BACKGROUND OF THE INVENTION

1. Field of the Invention

The present invention relates to a method for manufacturing a light-emitting device, and more particularly to a method for manufacturing an integrally formed multi-layer light-emitting device.

2. The Prior Arts

The light-emitting theory of LED takes advantage of the intrinsic properties of semiconductors, which is different from the theory of electric discharging, heat and light-emitting of an incandescent light tube. Because light is emitted when electric current forward flowed across the PN junction of a semiconductor, the LED is also called cold light. The LED has the features of high durability, long service life, light weight, low power consumption, and being free of toxic substances like mercury, and thereby it can be widely used in the industry of the light-emitting device, and the LEDs are often arranged in an array and often used in such as electric bulletin board or traffic sign.

Taiwanese Utility Model Patent No. M387375 disclosed a package structure of an array type multi-layer LED, which included a metal substrate, a package module, a lead frame, and a mask, wherein the metal substrate was disposed on the bottom of the package structure, and the package module was used for encapsulating and fixing the lead frame over the metal substrate. The LED dies were arranged in an array on the metal substrate. The lead frames were electrically connected with the LED dies. The mask covered the package module.

However, the conventional LED package structure includes a package module which is usually made of plastic resin. The heat-dissipation efficiency of the plastic resin is much less than that of metal. If the heat-dissipation efficiency is low, the lifetime and the light-emitting efficiency of the LED package structure will be decreased. Another problem existing in the prior art is that the metal substrate is not integrally formed with the package module, and thereby the manufacturing process is complicated. Accordingly, it is desirable to provide a light-emitting device capable of solving the problems existing in the conventional LED package structure, such as low heat-dissipation efficiency, high consumption of package material, etc.

SUMMARY OF THE INVENTION

An objective of the present invention is to provide a method for manufacturing an integrally formed multi-layer light-emitting device. The method of the present invention comprises the following steps: preparing a seat including a central main body and a plurality of heat dissipation fins, a central portion of the central main body having two through holes longitudinally formed therein; milling a bottom of the central main body to form a first chamber having an accommodating space concaved inwardly, a top of the central main body being milled to form a second chamber having an accommodating space concaved inwardly, the second chamber including a bottom and an inclined inner sidewall, the two through holes each being milled to form a step at one end near the second chamber; arranging two connection pieces in the two through holes, respectively, each connection piece including a conductive rod and a sleeve for inserting the conductive rod therein, two ends of each conductive rod being extended out of the sleeve, each conductive rod having a flange on one end near the chamber, the flange being placed on the step; arranging two fixing pieces in the two through holes, respectively, so that the two connection pieces are fixed in the seat; selectively electroplating a first reflective layer onto an area of the seat; arranging a plurality of light-emitting elements on the bottom; electrically connecting the light-emitting elements with one ends of the two connection pieces by wire-bonding with use of metal wires; and arranging a lens mask on the second chamber so that the seat is sealed by the lens mask.

The seat is integrally formed in such a manner that the light-emitting elements can fit in the chamber which is formed on the top of the central main body. In other words, the light-emitting elements can be directly disposed in the chamber on the top of the central main body. The seat is made of a metal having good thermal conductivity, and thereby the seat can effectively absorb the heat generated from the light emitting elements in operation, and rapidly transmit the heat to the surrounding environment. Therefore, the package module is not needed to be used in the present invention so that the consumption of the package material is reduced, and the manufacturing process is simplified.

According to one embodiment of the present invention, the integrally formed multi-layer light-emitting device can further includes a lens mask which is tightly engaged with the seat so that the lens mask covers and seals the top of the chamber formed on the top of the central main body. Therefore, the moisture and fine particles in air cannot enter the chamber, and thereby the light-emitting elements and the optical elements can be protected from deterioration of their properties.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
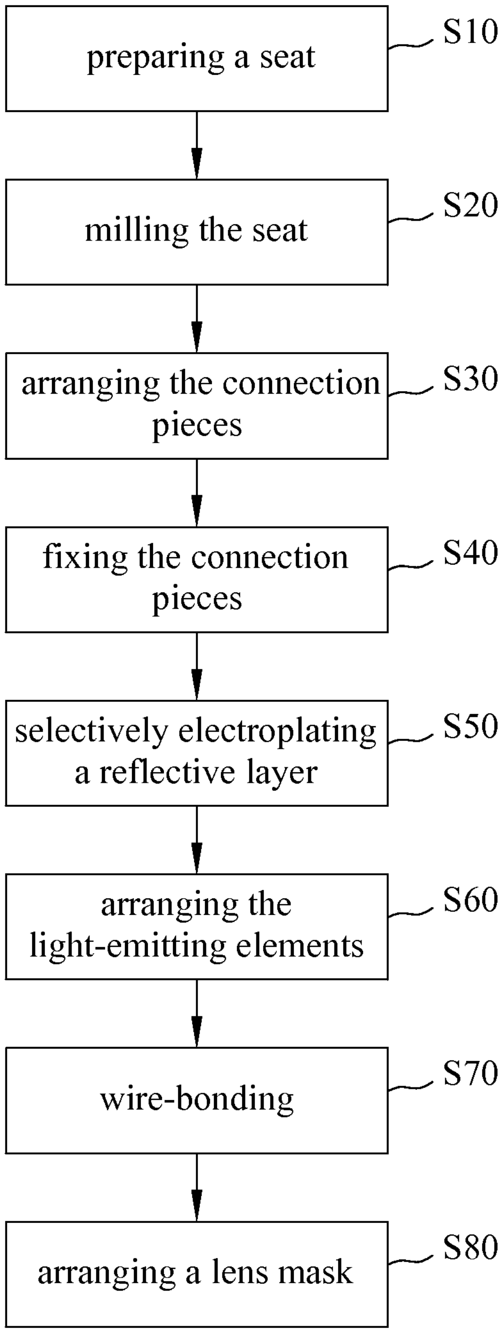
FIG. 1 is a flowchart showing a method for manufacturing an integrally formed multi-layer light-emitting device according to the present invention.
Figure 2:
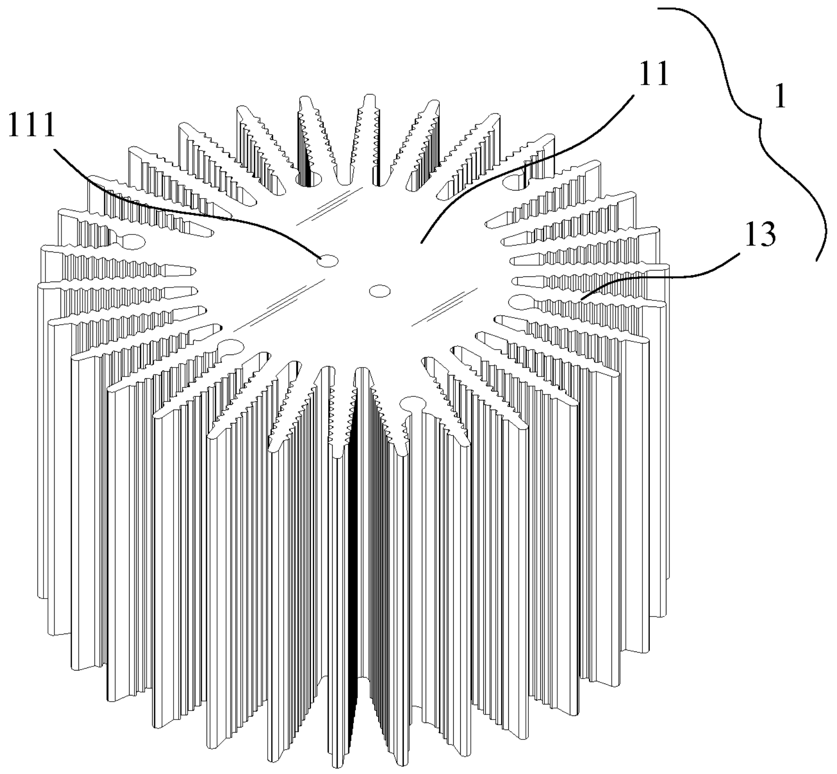
FIG. 2 is a schematic perspective view showing the seat of the integrally formed multi-layer light-emitting device according to the present invention.

FIG. 1 is a flowchart showing a method for manufacturing an integrally formed multi-layer light-emitting device according to the present invention. FIG. 2 is a schematic perspective view showing the seat of the integrally formed multi-layer light-emitting device according to the present invention.

In step S10, a seat 1 is prepared. As shown in FIG. 2, the seat 1 includes a central main body 11 and a plurality of heat dissipation fins 13. The seat is formed by squeezing and injecting of a metal, and the seat is made of aluminum, copper, or carbon. The heat dissipation fins 13 are extended radially outward from the cylindrical wall of the central main body 11. These heat dissipation fins 13 are spaced around the circumference of the central main body 11. Two sides of the heat dissipation fins 13 are designed to have a corrugated shape. The central portion of the central main body 11 has two through holes 111 longitudinally formed therein.

Figure 3A:
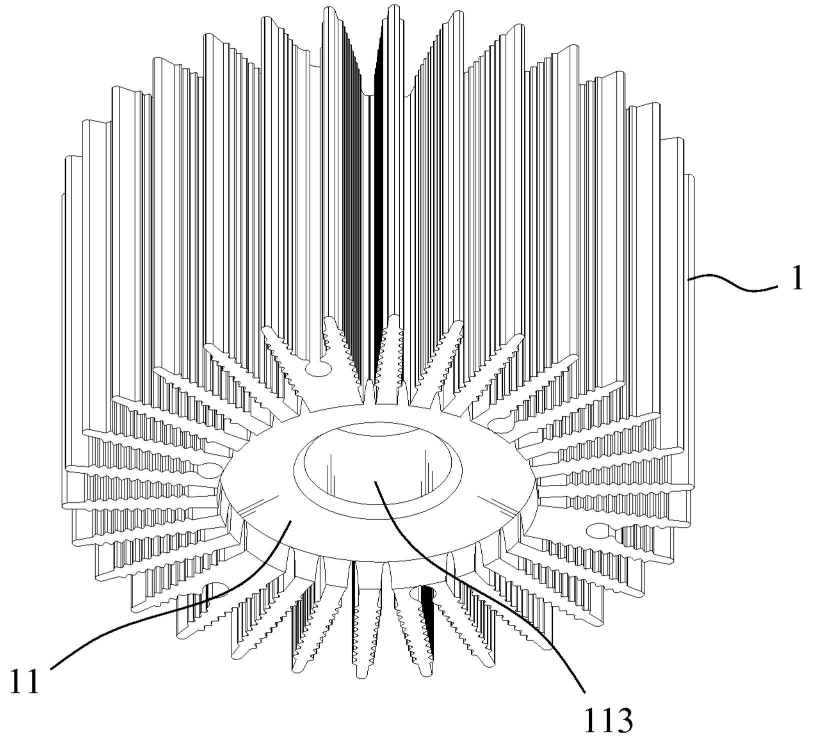
FIG. 3*a* is a schematic perspective view showing the milling of the seat of the integrally formed multi-layer light-emitting device according to one embodiment of the present invention.
Figure 3B:
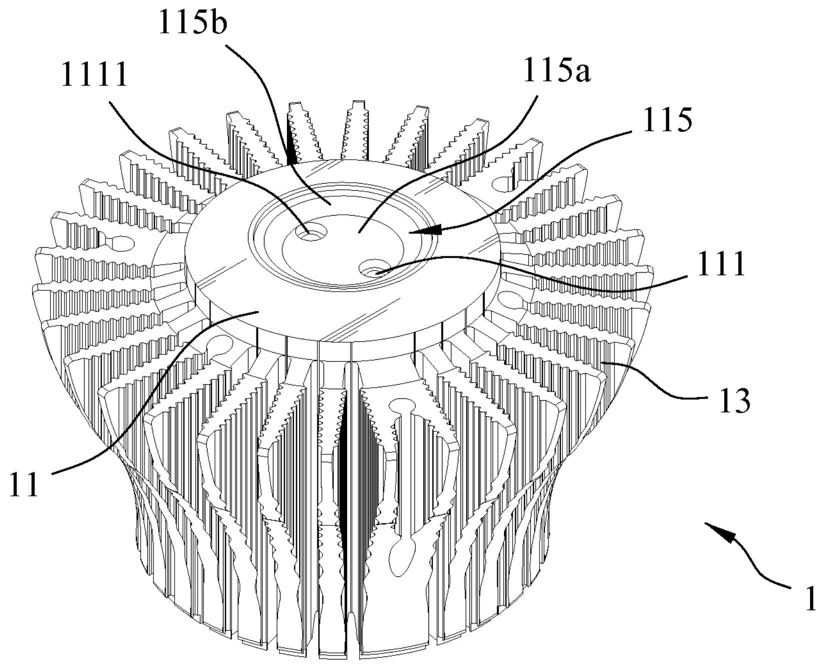
FIG. 3*b* is a schematic perspective view showing the milling of the seat of the integrally formed multi-layer light-emitting device according to another embodiment of the present invention.

In step S20, the bottom of the central main body 11 is milled by a cutter on its central portion to form a chamber 113 having an accommodating space concaved inwardly from the opening. The chamber 113 can be communicated with the two through holes 111, as shown in FIG. 3*a*. The tops of the heat dissipation fins 13 can be milled so that a portion of the central main body 11 can be exposed and protruded, as shown in FIG. 3*b*. The shape of the outer lateral sides of the heat dissipation fins 13 can be milled into a bent arc-like shape. The reason for that is that the lower portions of the heat dissipation fins 13 receive heat slower than the upper portions of the heat dissipation fins 13 do, but the widths of the lower portions of the heat dissipation fins 13 are smaller than the widths of the upper portions of the heat dissipation fins 13, and thereby the heat can be simultaneously dissipated to the surrounding environment through the lower portions and the upper portions of the heat dissipation fins 13 due to the shorter heat transfer path of the lower portions of the heat dissipation fins 13, and thereby the heat dissipation efficiency is greatly increased.

The top of the central main body 11 can be milled by a cutter to form a chamber 115 having an accommodating space concaved inwardly from the opening, and the chamber 115 includes a bottom 115*a* and an inclined inner sidewall 115*b*, as shown in FIG. 3*b*.

Furthermore, the two through holes 111 each can be milled to form a step 1111 at their sides near the chamber 115.

Figure 4A:
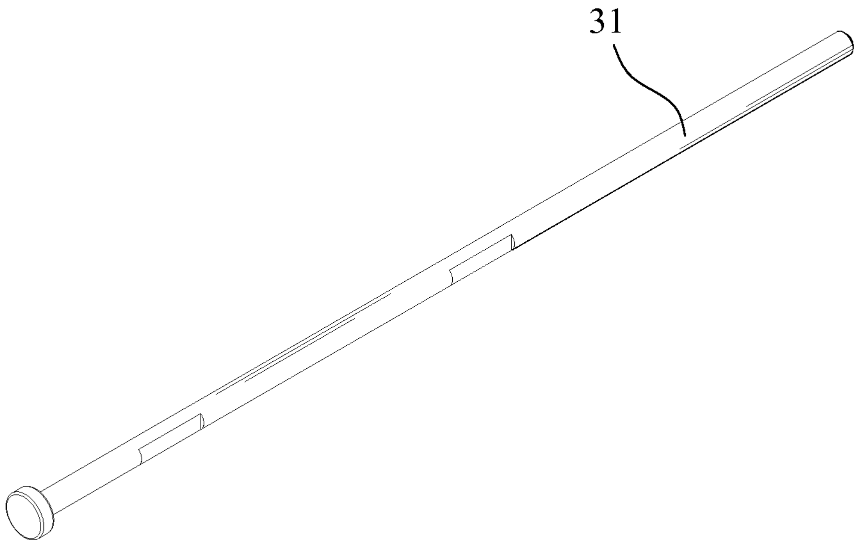
FIG. 4*a* is a schematic perspective view showing a conductive rod of a connection piece according to one embodiment of the present invention.
Figure 4B:
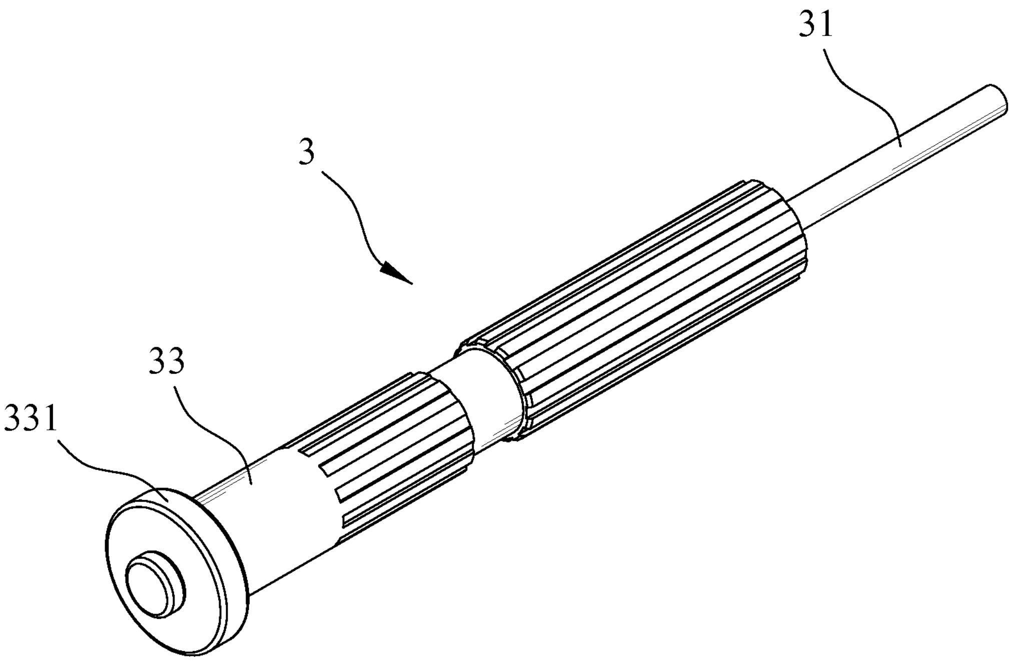
FIG. 4*b* is a schematic perspective view showing the connection piece of the integrally formed multi-layer light-emitting device according to one embodiment of the present invention.
Figure 5:
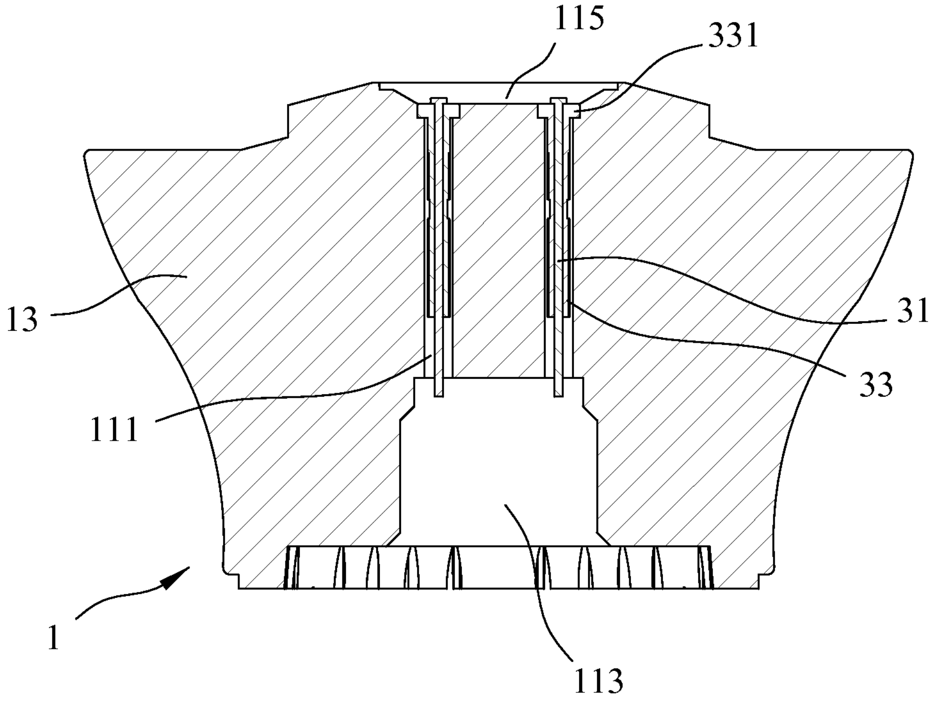
FIG. 5 is a schematic view showing the arrangement of the connection pieces of the integrally formed multi-layer light-emitting device according to one embodiment of the present invention.

FIG. 4*a* is a schematic perspective view showing a conductive rod of a connection piece according to the present invention. FIG. 4*b* is a schematic perspective view showing the connection piece of the integrally formed multi-layer light-emitting device according to the present invention. FIG. 5 is a schematic view showing the arrangement of the connection pieces of the integrally formed multi-layer light-emitting device according to the present invention.

In step S30, the two connection pieces 3 are respectively arranged in the two through holes 111, as shown in FIG. 5.

The connection piece 3 includes a conductive rod 31 and a sleeve 33 for inserting the conductive rod 31 therein. The two ends of the conductive rod 31 are extended out of the sleeve 33. The conductive rod 31 has a flange 331 on one end near the chamber 115. The flange 331 can be placed on the step 1111 so that the two connection pieces 3 can be respectively fixed in the two through holes 111. The sleeve 33 can be made of liquid crystalline polyester resin.

Figure 6:
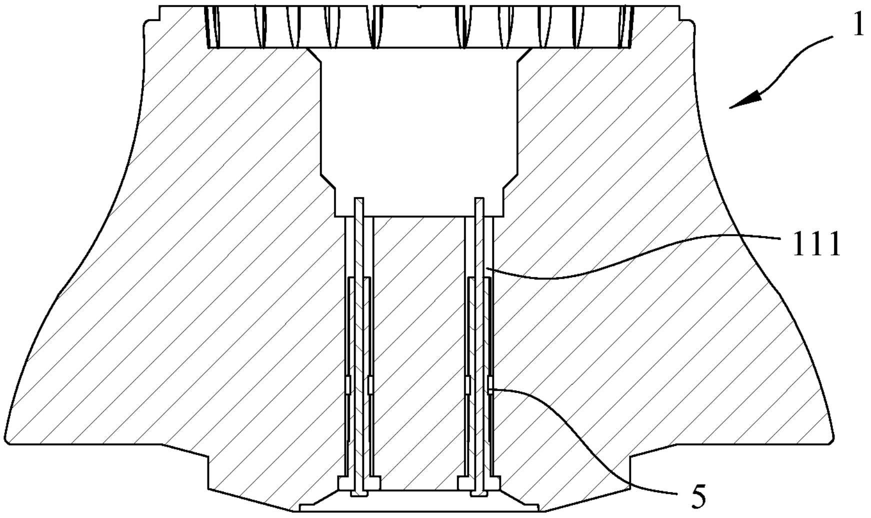
FIG. 6 is a schematic view showing that two connection pieces are fixed in the seat according to one embodiment of the present invention.
Figure 6A:
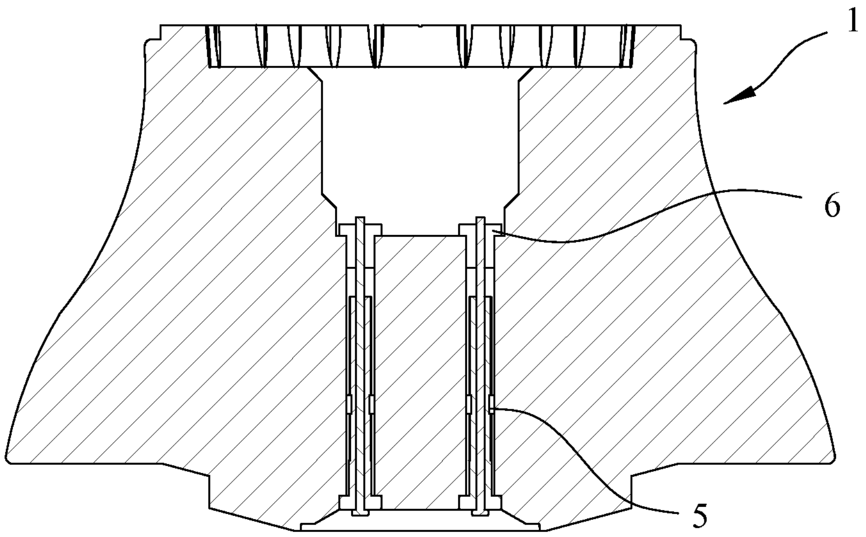
FIG. 6*a* is a schematic view showing that a plug is inserted into each through hole according to one embodiment of the present invention.

In step S40, the two fixing pieces 5 are respectively disposed in the two through holes 111 so that the two connection pieces 3 can be fixed in the seat 1, as shown in FIG. 6. The connection pieces 3 can be held by the fixing pieces 5, and the space of the two through holes 111 can be occupied by the fixing pieces 5. A plug 6 can be inserted into the opening of each through hole 111 at its end near the chamber 115, as shown in FIG. 6*a*, so that the connection pieces 3 can be firmly fixed, and the moisture in air can be prevented from entering the two through holes 111.

Figure 7:
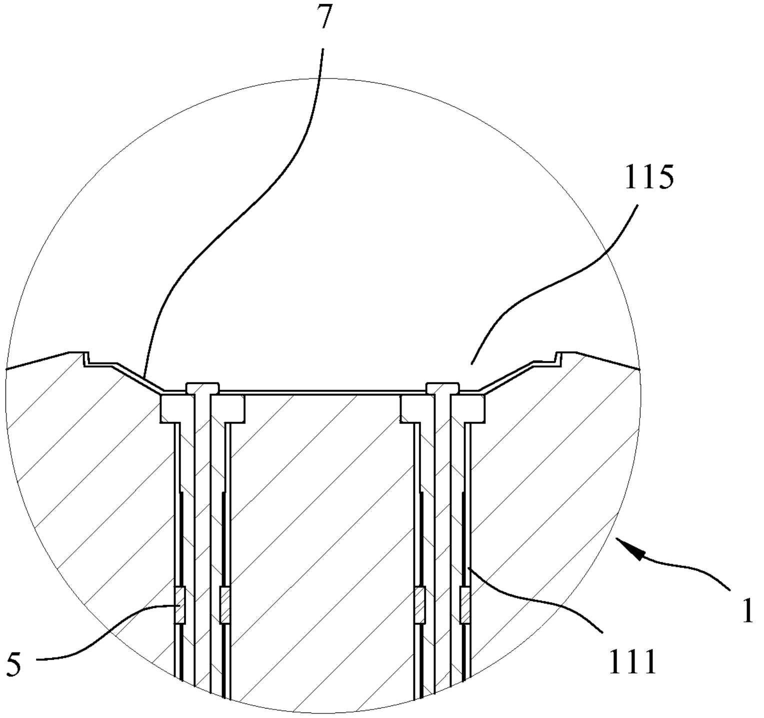
FIG. 7 is a schematic view showing that a first reflective layer is selectively electroplated according to one embodiment of the present invention.

In step S50, a first reflective layer 7 can be selectively electroplated onto an area of the seat 1, for example, the bottom 115*a* and/or the inner sidewall 115*b*, as shown in FIG. 7. A second reflective layer (not shown in the figures) can be electroplated onto the first reflective layer 7. The first reflective layer 7 and the second reflective layer can be made of chromium, silver, or any other suitable metals.

Figure 8:
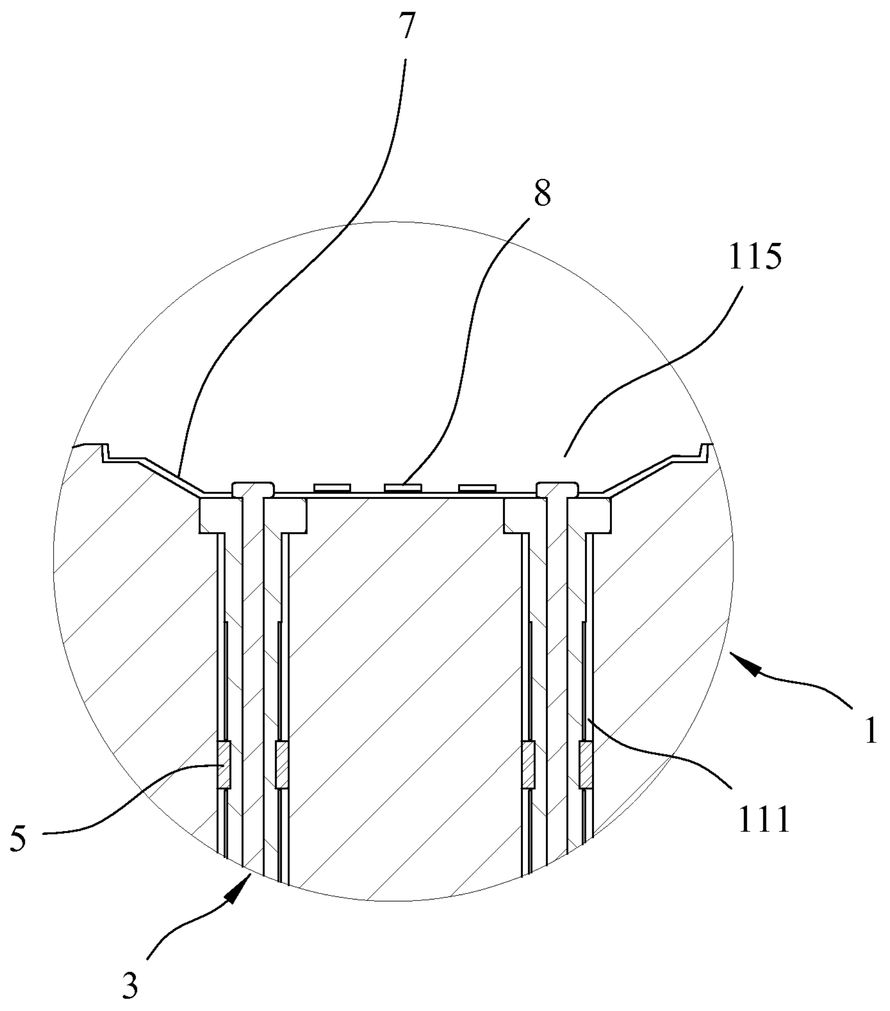
FIG. 8 is a schematic view showing that the light-emitting elements are arranged on the first reflective layer according to one embodiment of the present invention.

In step S60, the light-emitting elements 8 are directly arranged on the first reflective layer 7 or the second reflective layer formed on the bottom 115*a*, as shown in FIG. 8.

Figure 9:
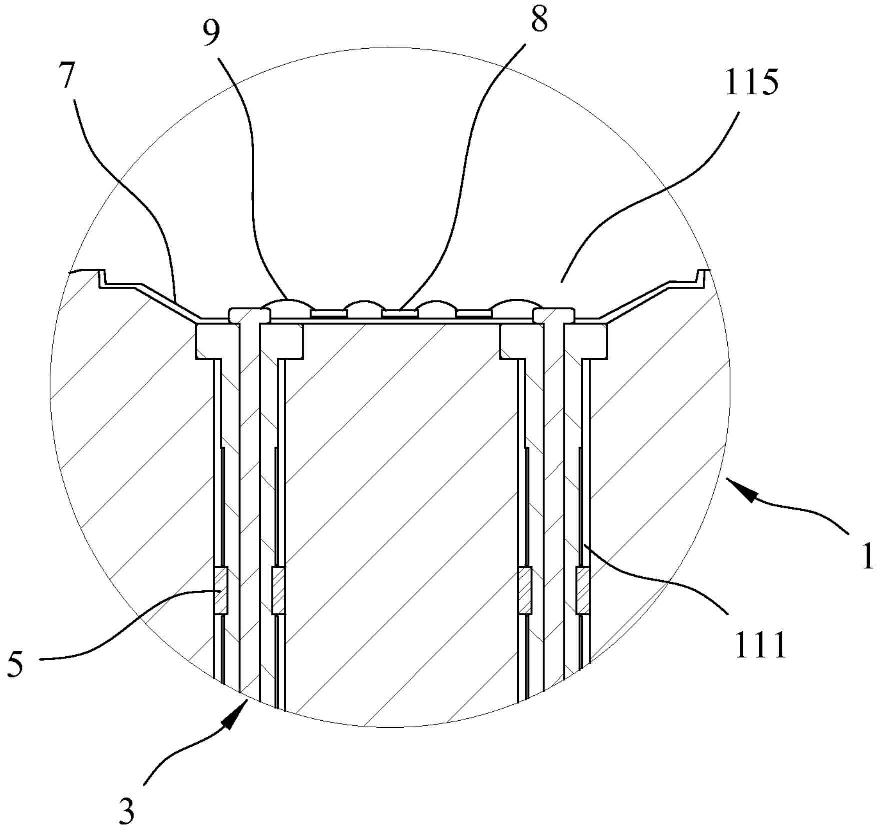
FIG. 9 is a schematic view showing that the light-emitting elements are arrange on the bottom by wire-bonding according to one embodiment of the present invention.
Figure 10:
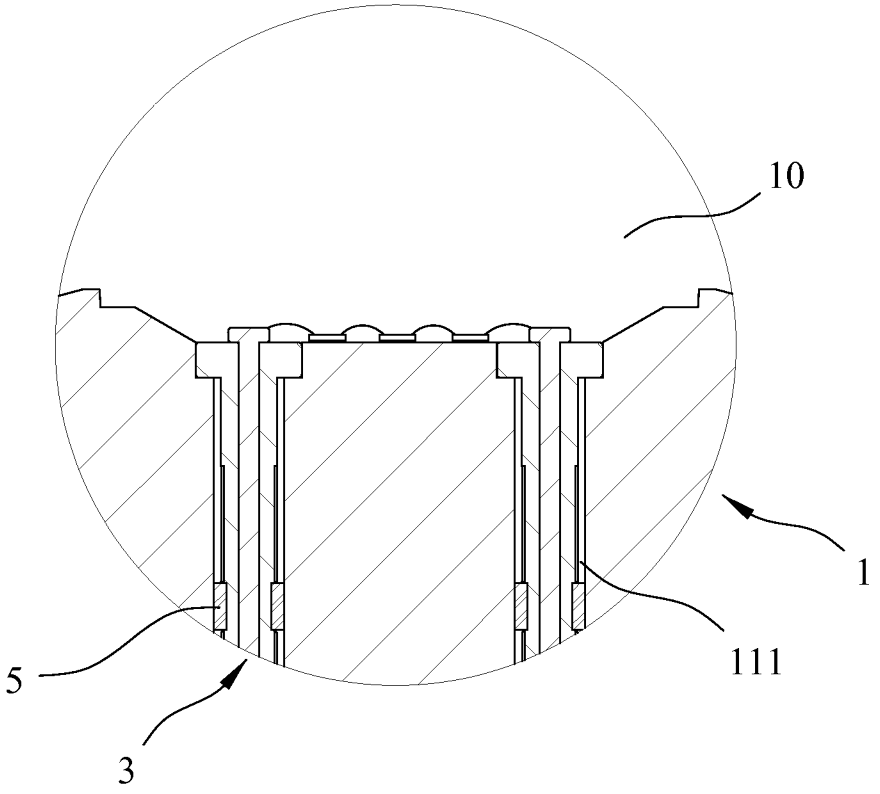
FIG. 10 is a schematic view showing that a lens mask is arranged on the chamber according to one embodiment of the present invention.

In step S70, the light-emitting elements 8 can be arranged in an array on the bottom 115*a*, and electrically connected with one ends of the two connection pieces 3 by wire-bonding with the use of the metal wires 9, as shown in FIG. 9. The light-emitting elements are, for example, a plurality of LED dies. Another ends of the two connection pieces 3 are respectively electrically connected with the negative end and the positive end of the electrical power source (not shown in the figures). Thus, the electrical power source, the two connection pieces 3, the metal wires 9, and the light-emitting elements 8 are electrically connected together to form a circuit. The light-emitting elements 8 can emit light when the electrical power source is turned on. The metal wires 9 can be made of gold, copper, or any other suitable metals. A connection pad (not shown in the figures) can be disposed on the top of the conductive rod 31 for wire-bonding of the light-emitting elements 8.

In step S80, the integrally formed multi-layer light-emitting device can further includes a lens mask 10 arranged on the chamber 115 so that the seat 1 can be sealed by the lens mask 10, and the moisture and fine particles in air can be prevented from entering the chamber 115.

Figure 11:
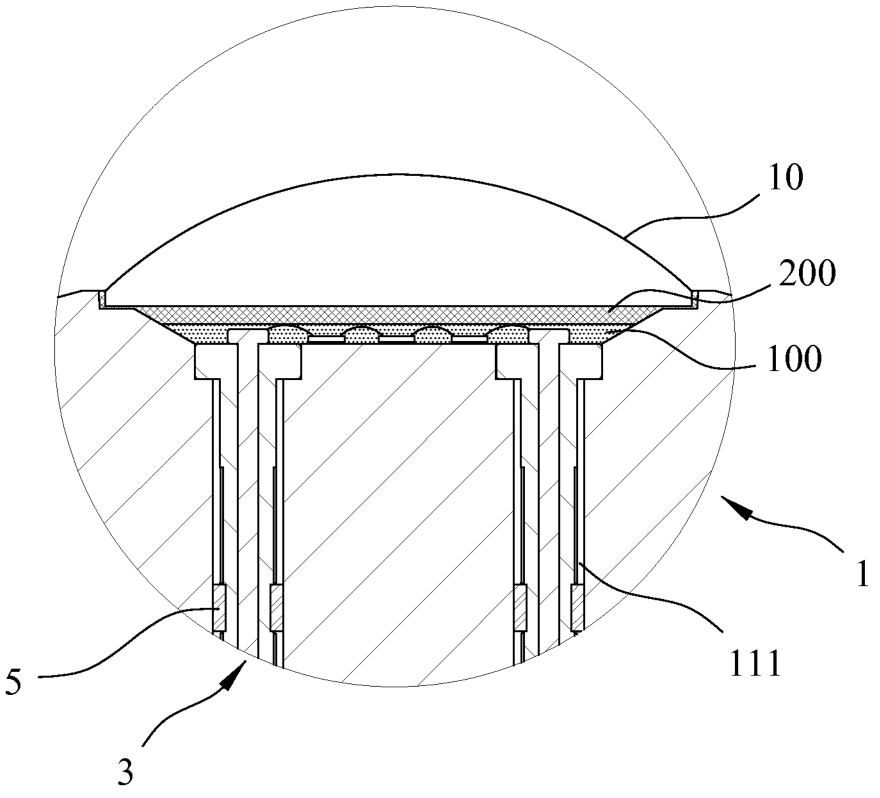
FIG. 11 is a schematic view showing that the integrally formed multi-layer light-emitting device according to one embodiment of the present invention.

FIG. 11 is a schematic view showing the integrally formed multi-layer light-emitting device according to one embodiment of the present invention. Referring to FIG. 11, a phosphor layer 100 used for light mixing, and a silica gel protection layer 200 used for protecting the phosphor layer 100 can be sequentially formed on the light-emitting elements 8.

The chamber 113 can be used for accommodating the power connector, the power supply module, and the wireless transfer module. The chamber 113 is hollow so that the seat 1 is lightweight, and the heat cannot be directly transferred to the power supply module and the wireless transfer module, and also the chamber 113 can have the heat-dissipation function.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for manufacturing an integrally formed multi-layer light-emitting device, comprising the following steps:

preparing a seat including a central main body and a plurality of heat dissipation fins, a central portion of the central main body having two through holes longitudinally formed therein;

milling a bottom of the central main body to form a first chamber having an accommodating space concaved inwardly, a top of the central main body being milled to form a second chamber having an accommodating space concaved inwardly, the second chamber including a bottom and an inclined inner sidewall, the two through holes each being milled to form a step at one end near the second chamber;

arranging two connection pieces in the two through holes, respectively, each connection piece including a conductive rod and a sleeve for inserting the conductive rod therein, two ends of each conductive rod being extended out of the sleeve, each conductive rod having a flange on one end near the second chamber, the flange being placed on the step;

arranging two fixing pieces in the two through holes, respectively, so that the two connection pieces are fixed in the seat;

selectively electroplating a first reflective layer onto an area of the seat;

arranging a plurality of light-emitting elements on the bottom;

electrically connecting the light-emitting elements with one ends of the two connection pieces by wire-bonding with use of metal wires; and arranging a lens mask on the second chamber, so that the seat is sealed by the lens mask.

2. The method according to claim 1, wherein the seat is formed by squeezing and injecting of a metal.

3. The method according to claim 1, wherein the seat is made of aluminum, copper, or carbon.

4. The method according to claim 1, wherein the sleeve is made of liquid crystalline polyester resin.

5. The method according to claim 1, wherein a plug is inserted into an opening of each through hole near the first chamber.

6. The method according to claim 1, wherein the area includes the bottom, the inner sidewall, or combination thereof of the second chamber.

7. The method according to claim 1, wherein a second reflective layer is electroplated onto the first reflective layer.

8. The method according to claim 7, wherein the first reflective layer and the second reflective layer are made of chromium, or silver.

9. The method according to claim 1, wherein the light-emitting elements are a plurality of LED dies.

10. The method according to claim 1, wherein a phosphor layer and a silica gel protection layer are sequentially formed on the light-emitting elements.

11. The method according to claim 1, wherein the metal wires are made of gold, or copper.

12. The method according to claim 1, wherein a connection pad is disposed on a top of the conductive rod for wire-bonding of the light-emitting elements.

* * * * *